(12) United States Patent
Letts et al.

(10) Patent No.: US 7,359,810 B2
(45) Date of Patent: Apr. 15, 2008

(54) CHARACTERIZING NEWLY ACQUIRED WAVEFORMS FOR IDENTIFICATION OF WAVEFORM ANOMALIES

(75) Inventors: Peter J. Letts, Beaverton, OR (US); Kenneth P. Dobyns, Beaverton, OR (US); Paul M. Gerlach, Beaverton, OR (US); Kristie Veith, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/961,445

(22) Filed: Mar. 18, 2005

(65) Prior Publication Data

US 2006/0212239 A1   Sep. 21, 2006

(51) Int. Cl.
*G01R 13/00* (2006.01)
(52) U.S. Cl. ............................ 702/66; 702/67; 702/68; 702/69; 702/70; 702/71; 345/440.1
(58) Field of Classification Search .................. 702/66, 702/67–71, 179–190; 345/440.1
See application file for complete search history.

(56) References Cited

U.S. PATENT DOCUMENTS 6,163,758 A  * 12/2000 Sullivan et al. ............... 702/66
6,493,400 B1 * 12/2002 Greeley et al. ............. 375/297
2002/0180737 A1* 12/2002 Letts ....................... 345/440.1

* cited by examiner

*Primary Examiner*—Hal Wachsman
*Assistant Examiner*—Phuong Huynh
(74) *Attorney, Agent, or Firm*—Francis I. Gray; Thomas F. Lenihan

(57) ABSTRACT

A method of characterizing a newly acquired waveform with respect to previously acquired waveforms during monitoring of a generally repetitive signal, where the previously acquired waveforms have been rasterized into a two-dimensional array of memory locations, reads history values for those memory locations associated with an active portion of the newly acquired waveform, compares the history values with history value ranges, increments a count for one of a plurality of recent pixel counters corresponding to the history value ranges, each counter having a different history value range, and modifies the history values in the memory locations. From the counts accumulated for each of the history value ranges the variability of the newly acquired waveform from the generally repetitive signal is determined.

17 Claims, 6 Drawing Sheets

CHARACTERIZING NEWLY ACQUIRED WAVEFORMS FOR IDENTIFICATION OF WAVEFORM ANOMALIES

BACKGROUND OF THE INVENTION

The present invention relates to definition and detection of unusual waveforms acquired by a digital oscilloscope, and more particularly to characterizing newly acquired waveforms for identification of waveform anomalies.

In analog oscilloscopes employing cathode ray tubes (CRTs) for display, variable brightness of the screen display communicates useful information about the activity of the signal being observed. As an analog oscilloscope generates vertical excursions during a horizontal sweep interval to provide a real-time picture of the signal activity at the probe tip, it inherently tends to vary the brightness of the display as an inverse function of the slope of the line it produces.

One feature of an analog oscilloscope or a digital oscilloscope with a high waveform throughput is the ability to detect an intermittent signal anomaly that occurs in an otherwise repetitive signal. Analog oscilloscopes show a faint trace indicating the presence of this intermittent anomalous signal behavior. Of course, if the signal becomes too intermittent, the trace is so faint in brightness that it may be missed entirely by the oscilloscope operator.

U.S. Pat. No. 6,163,758 (Sullivan, et al.), entitled Detection of Unusual Waveforms and assigned to the same assignee as the present invention, discloses an arrangement for detecting unusual waveforms where waveforms are highly repetitive by counting the number of new pixels that are drawn on a screen display, and for generating an alert signal if the number of new pixels exceeds a threshold value. New pixels are defined as those pixels that have never been previously touched by any waveform since the beginning of the present acquisition series, or as those pixels which have not been affected for some interval of time as measured by the decay of values stored in a raster memory. The hardware consists of a single counter and threshold for detecting a significant number of new pixels, and a software algorithm dynamically computes the threshold value. However this presents a rather simplistic characterization of the unusual waveform.

What is desired is a method of characterizing newly acquired waveforms for identifying waveform anomalies based on the variability of a newly acquired waveform from one or more previously acquired waveforms.

BRIEF SUMMARY OF THE INVENTION

Accordingly the invention characterizes waveform variability within the context of examining data associated with multiple acquisitions of a generally repetitive signal. A newly acquired waveform is rasterized into a raster memory using a read-modify-write operation. Each data point of the newly acquired waveform is used as an address into the raster memory, and a history value associated with the data point is read and compared with a plurality of history ranges, each history range being associated with a different one of a corresponding plurality of recent pixel counters. The recent pixel counter associated with the history value is incremented, and the history value is modified and written back into the raster memory. After the new acquired waveform is completely rasterized, the respective counts of the counters are analyzed, such as comparing them with respective thresholds, to produce a violation or alarm vector. The vector is processed by a controller to determine the type of anomaly represented by the newly acquired waveform.

Noise smoothing is performed by temporarily counting "new" waveform points in a sequence, stopping the count when a non-new waveform point is encountered and comparing the count to a threshold. If the count is low indicating noise, then the counter is reset. If the count is high and/or the number of non-new waveform points between new waveform points is low, the counter is restarted to continue to count the new waveform points.

Alternatively the newly acquired waveform may be compared with a previously acquired waveform stored in memory or with a rasterized waveform stored in memory to produce a difference waveform. The difference waveform may be processed or processed with prior difference waveforms to obtain further information about the variability of the input signal from its repetitive nature, taking into account trigger jitter in acquiring the waveform.

The objects, advantages and other novel features of the present invention are apparent from the following detailed description when read in conjunction with the appended claims and attached drawing.

DETAILED DESCRIPTION OF THE INVENTION

Figure 1:
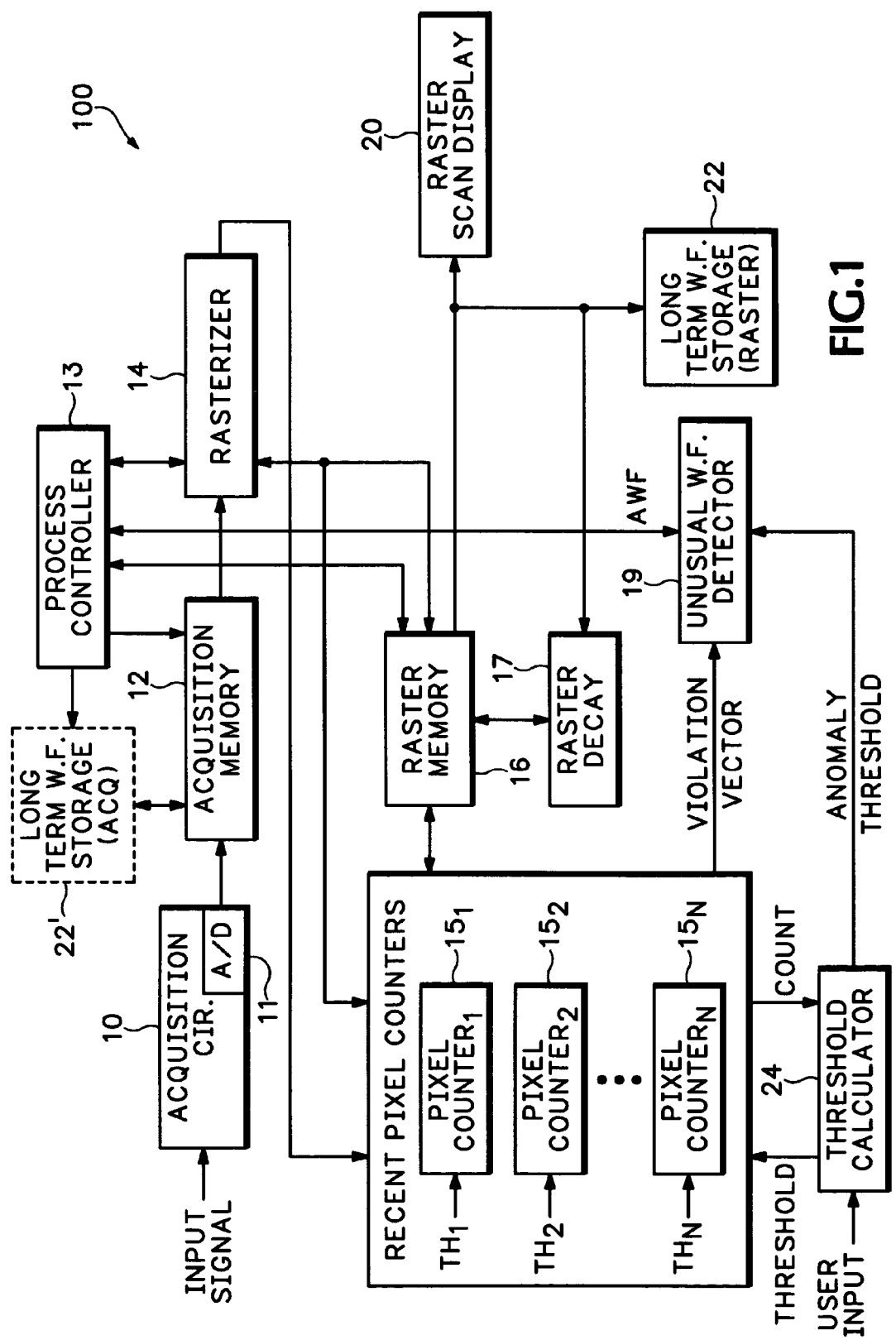
FIG. 1 shows a high-level block diagram view of an apparatus according to the present invention.

Referring now to FIG. 1 a test and measurement device 100, such as a digital storage oscilloscope (DSO), is shown having a signal acquisition circuit 10 including an analog-to-digital (A/D) converter 11, an acquisition memory 12, a process controller 13, a rasterizer 14, a plurality of recent pixel counters $15_1$ through $15_N$ (collectively a recent pixel counter array 15), a raster memory 16, a raster decay module 17, an unusual waveform detector module 19, a raster scan display device 20, a long term raster waveform storage memory 22, a long term acquisition waveform storage memory 22' (optional) and a threshold calculator 24.

The acquisition circuit 10 tracks and periodically samples an input signal. The analog-to-digital converter 11 produces as its output a stream of binary values describing the amplitude (Y) of the input signal tracked by the acquisition circuit 10 as a function of time. These amplitude values are stored at sequentially related addresses (T) in the acquisition memory 12 and, optionally, in the long term waveform storage memory 22'. The resulting data-address pairs (Y,T) are subsequently sent to the rasterizer 14 according to directions from the process controller 13.

The rasterizer 14 converts each single data-address pair into a position (or converts a sequential pair of data-address pairs defining a vector into a sequence of positions) within a two-dimensional array of rows and columns that eventually are mapped, illustratively, to the raster scan display 20 as corresponding picture elements (pixels). The rasterizer 14 typically operates on one column of the raster (two-dimensional array) at a time, performing read-modify-write operations on each memory location in the raster memory 16 that corresponds to a position of the acquired waveform. The read-modify-write operation includes reading the raster memory address associated with a current position for the newly acquired waveform, generally increasing or modifying the history value associated with that position according to a function defined by the process controller 13, and writing back to the raster memory address the modified history value. Between waveform acquisitions the raster decay module 17 operates to periodically decrease the history values of each position within the raster memory 16, illustratively by multiplying the history value by a fraction less than 1 after every X acquisitions or a defined time increment.

Thus, for each waveform drawn by the rasterizer 14 into the raster memory 16, those memory locations associated with positions corresponding to the newly rasterized waveform (i.e., waveform pixels) have history values that generally are increased within the raster memory, while all memory locations periodically are decreased within the raster memory. Over time a net decrease in value occurs for positions not corresponding to newly rasterized waveforms (i.e., non-waveform pixels). If a particular position is not associated with any waveform for some number of rasterizations, then the history value of that position eventually decreases to zero. In this manner, a persistence function similar to that provided within the context of an analog oscilloscope is provided. One exemplary rasterizer embodiment is discussed in more detail in U.S. Pat. No. 6,104,374, for "Sparse Vector Rasterization" (Sullivan, et al.), issued 15 Aug. 2000, and herein incorporated by reference in its entirety. Multiple column raster operation is performed in alternate embodiments.

Each position within the raster memory is represented by an n-bit data word. Each n-bit word has, illustratively, an identification field and a numeric representation field. The identification field enables identification of different types of data. The data types may be data associated with a particular input channel, a test mask and the like. The rasterizer 14 may provide different processing of the history values in the raster memory 16 depending upon whether the positions match or don't matching the input channel or test mask associated with the identification field. For example, matching (or non-matching) positions may be highlighted in terms of intensity, color or a combination thereof when mapped to the raster scan display 20. Such positions may be increased or decreased by different values (or set to a constant value). Generally speaking, positions located in an area associated with anomalous waveform behavior may be so identified to enable special processing by the rasterizer 14 or other functional element such as the raster scan display 20.

The numeric representation field is used to keep track of the history value of the position. The history value may be a number of increments (by one or some other value), a number of other events, a function of a prior history value, etc. The below descriptions may be readily modified to support multiple data types and/or numerically associated characteristics.

Where the prior art used a single counter to count the number of new pixels associated with each newly rasterized waveform, the present invention provides the array of recent pixel counters 15 where each of the recent pixel counters $15_1$ through $15_N$ within the recent pixel counter array is used to count the number of positions within the raster memory 16 corresponding to the newly acquired waveform which has a history value within a specified range during the read cycle of the read-modify-write operation. The history value of each position is determined by examining the memory location within the raster memory 16 associated with that position. Each of the memory locations within the raster memory 16 associated with a new waveform pixel is examined to determine its history value. For each instance of a history value corresponding to one of N history value ranges, the corresponding recent pixel counter $15_1$ through $15_N$ associated with that history value range is incremented. Thus, for each newly rasterized waveform, the recent pixel counter array 15 indicates how many pixels within the newly rasterized waveform correspond to each of the plurality of history value ranges. In this manner, the variability of the newly rasterized waveform as compared to previously rasterized waveforms may be characterized, such as what fraction of the newly rasterized waveform is similar to frequently or infrequently occurring segments of a generally repetitive signal. In other words as part of the read-modify-write process, the history value for the location corresponding to a current data address pair for the newly acquired waveform is used to increment one of the counters according to the value range into which it falls, the history value is modified since it corresponds to the newly acquired waveform, and is finally written back into the current data address.

Each of the recent pixel counters $15_1$ through $15_N$ is associated with a corresponding threshold level $TH_1$ through $TH_N$. The threshold levels may be predetermined, modified in response to user input (via, e.g., the threshold calculator 24 or process controller 13) or modified by the process controller 13 in response to a threshold level modification algorithm. Each of the recent pixel counters 15 provides an alarm indication or logic output in response to pixel count excursions beyond its threshold level. Each recent pixel counter 15 may be associated with more than one threshold level, and multiple alarms or logic levels may be associated with the multiple threshold levels.

The threshold calculator 24, in response to user input and/or current or previous values of the recent pixel counters $15_1$ through $15_N$, establishes or modifies the threshold levels $TH_1$ through $TH_N$ via a control signal THRESHOLD provided to the recent pixel counters 15. The threshold calculator 24 may read the count of any of the recent pixel counters via a control signal COUNT provided by the recent pixel counter array 15. When the rasterizer 14 has finished rasterizing the newly acquired waveform, the unusual waveform detector 19 examines a signal VIOLATION VECTOR produced by the recent pixel counter array 15 to see if any of the recent pixel counters $15_1$ through $15_N$ has violated its corresponding threshold level $TH_1$ through $TH_N$. This N-dimensional vector of true or false logic values is used to signal that the newly rasterized waveform may be unusual or may contain anomalous waveform portions. Such an anomalous waveform (AWF) signal is communicated to the process controller 13 which may further analyze the recent pixel counter values, the amplitude values in the acquisition memory 12, and/or the contents of the raster memory 16 to make a final determination of the existence and type of anomaly.

The process controller 13 operates to coordinate the activities of the acquisition memory 12, the rasterizer 14, the raster memory 16 and the unusual waveform detector 19. The process controller 13 also performs various functions as will be further described below. The process controller 13 includes a processor, input/output (I/O) circuitry, memory and the like (not shown) suitable for implementing the methods and functions discussed herein.

As shown in FIG. 1, the threshold calculator 24 is discussed as an independent functional element. However, in alternative embodiments, the threshold calculator 24 may be included within the process controller 13. As such, in these alternative embodiments the interconnections discussed herein with respect to the threshold calculator 24 are interconnections with the process controller 13.

A first pixel counter (e.g., pixel counter $15_1$) may be used to count the number of "new" pixels, as in the prior art discussed above. A new pixel may be a pixel that heretofore had never been associated with a waveform or, alternatively, has not been associated with a waveform for a predetermined amount of time or number of acquired waveforms. Each of the corresponding second (e.g., pixel counter $15_2$) through N (e.g., pixel counter $15_N$) recent pixel counters is used to count the number of positions of the raster memory 16 corresponding to the new acquired waveform that are within each of the corresponding plurality of history value ranges. For example, assuming 16 possible history values for each memory location and setting N equal to 8, each pixel range of the second to Nth recent pixel counter $15_1$ to $15_N$ may be associated with a 2- or 3-count history value range. N may be increased or decreased depending upon the desired precision in waveform characterization. Generally speaking, as N increases the characterization accuracy of the waveform increases, but the amount of memory required to support such characterization also increases.

In the case of a repetitive signal, each of the positions associated with the rasterized waveforms quickly reaches a high history value and stays there. Where newly rasterized waveforms are slightly different from the repetitive waveform, those positions associated with deviations from the repetitive waveform are periodically increased in history value. The frequency of such history value increase depends upon how often the anomaly or measurement change underlying the anomalous waveform occurs. The more frequently the anomalous waveform occurs, the more frequently the history values of memory locations associated with the anomalous waveform increase. This modification to the increase/decrease of history values may be characterized as being distributed across each of the plurality of history value ranges. The number of positions in the newly rasterized waveform corresponding to each of these history value ranges is indicated by the count within the recent pixel counter array 15 corresponding to each of the history value ranges.

After each newly acquired waveform rasterization, each of the recent pixel counters $15_1$ through $15_N$ provides a corresponding count of pixels within that range to the threshold calculator 24 and to the unusual waveform detector 19. The threshold calculator 24 optionally uses user input in formulating an anomaly threshold level, which in turn is communicated to the unusual waveform detector 19. The unusual waveform detector 19 compares the new (assuming the first recent pixel counter $15_1$ has a threshold level of one count) and recent pixel counts with the anomaly threshold levels received from the threshold calculator 24 to determine if the anomalous waveform is present. If the anomalous waveform is present, then the AWF signal is provided to the process controller 13 indicative of such event. The anomalous waveform signal (AWF) provided to the process controller 13 includes an indication of new waveforms, an indication of slightly anomalous waveforms, an indication of highly anomalous waveforms and, optionally, other information. User input for adjusting system behavior may be supplied via a sensitivity control parameter or anomalous behavior parameter accessed via, for example, a user input device or menu structure associated with the DSO.

The process controller 13, in response to the anomalous waveform signal, optionally causes a mapping of the anomalous waveform to the raster scan display 20 using an algorithm such that the anomalous waveform is readily discernible by a user. Other responses by the process controller 13 are selectable by the user. For example, intensity values of pixels mapped to the raster scan display 20 associated with the anomalous waveform may be maximized while attenuating non-anomalous waveform pixels. Anomalous waveforms may also be automatically stored in response to their detection. In one embodiment, the contents of the acquisition memory 12 associated with the anomalous waveform are stored in the long-term acquisition waveform storage memory 22'. Similarly, the portions of the raster memory 16 associated with the anomalous waveform may be stored in the long-term raster waveform storage memory 22. Both storage operations may be performed concurrently. Optionally, user selection between point and vector representations of waveforms may be automatically effected to enable a user to zoom or otherwise enhance portions of the anomalous waveform for subsequent study.

The presence of the anomalous waveform input to the process controller 13 causes it to take several actions, some of which may depend on user choices. The process controller 13 may cause the display mapping of the anomalous waveform using maximum intensity values, zoom a view of the waveform and the like. As previously noted, in various embodiments each position within an array of positions has associated with it a type identifier. The process controller 13 optionally adapts the processing of each position according to its corresponding type identifier. Such adaptations may include, for example, a highlighting of a position, an incrementing of a position by a different value and a setting of a position to a predetermined value. The type identifier may be used to indicate that a position is associated with an excluded (mask) pixel area and/or a particular input channel.

Figure 2:
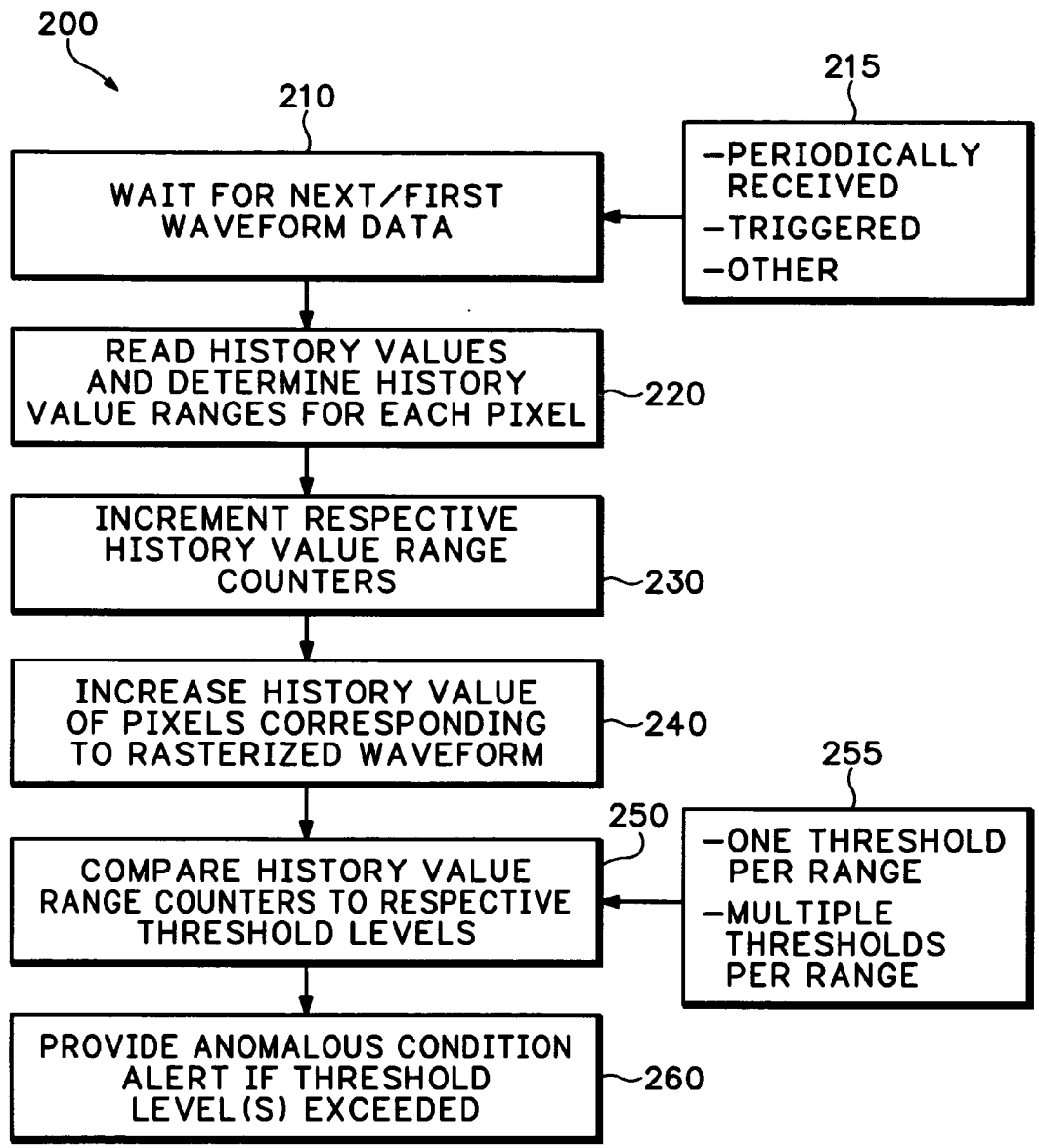
FIG. 2 shows a flow diagram view of a method according to the present invention.

FIG. 2 shows a flow diagram for characterizing waveform variability such that, for example, anomalous conditions within a sequence of substantially repetitive waveforms may be identified. The method 200 of FIG. 2 is entered at step 210, when the process controller 13 waits for the next (or first) waveform data to be acquired. As noted in box 215, the waveform data may be periodically received, received in response to a trigger event or received in some other manner. Referring to the embodiment of FIG. 1, the acquisition circuitry 10 processes an input signal to produce an acquired data stream which is stored in acquisition memory 12. The rasterizer 14 converts the acquired sample stream into rasterized data suitable for mapping to the raster scan display device 20. The method 200 operates upon the rasterized waveform data.

At step 220, the history values of pixels corresponding to the newly acquired waveform are read from the raster memory 16 as each address data pair from the acquisition memory 12 is processed. The history value range is determined for each history value and the corresponding counter is incremented (step 230). The history value is then modified and written back into the raster memory (step 240). That is, the history values of those pixels associated with or traversed by the newly rasterized waveform are modified.

At step 250, each of the history value range counters are compared to respective threshold levels to see if the corresponding counts violate the respective threshold levels. Referring to box 255, in one embodiment of the invention one threshold level per range is used, while in alternate embodiments of the invention multiple threshold levels per range are used. In still further embodiments, some history value range counters are compared to only one threshold level, while other history value range counters are compared to multiple threshold levels.

At step 260, an anomalous condition alert is provided if one or more of the threshold levels associated with history value range counters is violated. Alternatively, an anomalous condition alert is provided where specific threshold levels associated with specific history value range counters are violated. That is, in this embodiment an anomalous condition alert is only provided where a specific criterion associated with excursions of pixel counters beyond respective threshold levels is met.

While the operation of the method of FIG. 2 is described within the context of acquiring data and processing the data in substantially real time, the method may also be used to perform post-processing operations on previously acquired data. For example, waveform related data may be retrieved from the long term raster waveform storage memory 22 or long term waveform storage memory 22' for subsequent processing to determine whether one or more waveforms (or data sets associated with waveforms) may be characterized as exhibiting anomalous waveform behavior as described herein. Thus, those steps within the method that contemplate waiting for an acquisition event to occur are replaced by comparable steps that retrieve appropriate previously acquired data.

Figure 3:
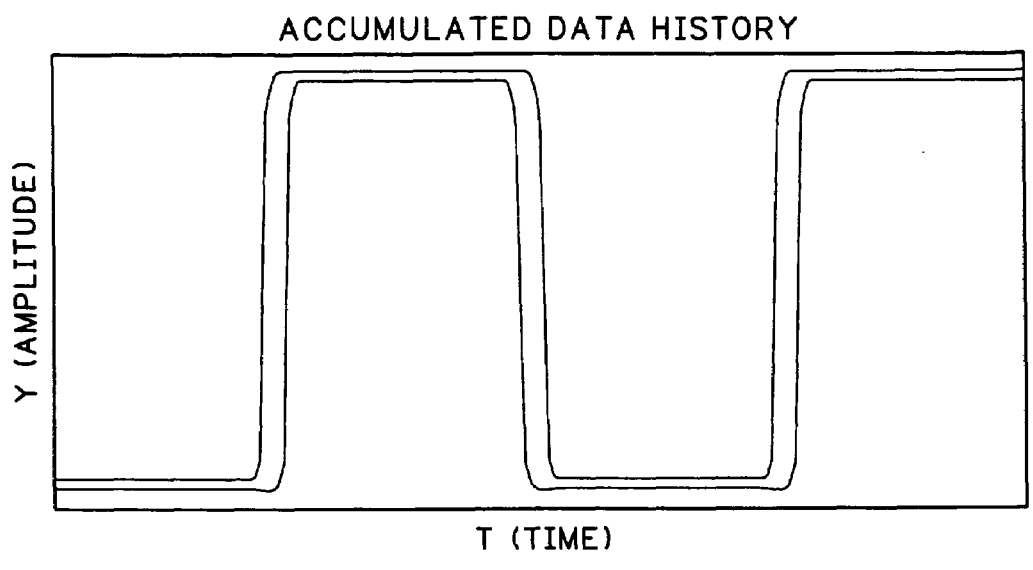
FIG. 3 shows a graphic view of a repetitive waveform rasterized over several acquisitions.
Figure 4:
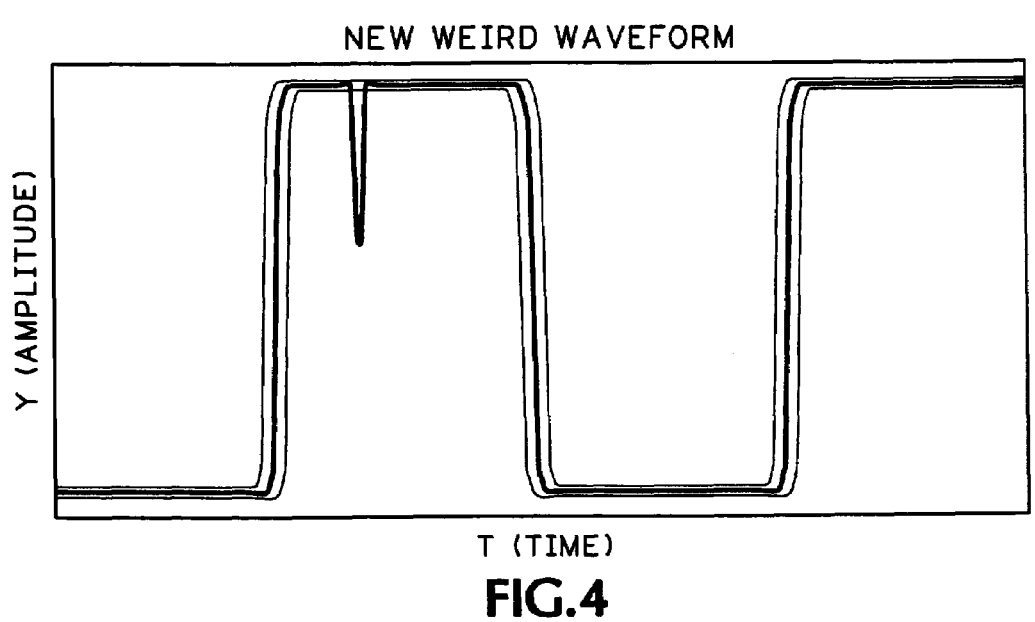
FIG. 4 shows a graphic view of a newly rasterized anomalous waveform overlaid on a repetitive waveform rasterized over several acquisitions.
Figure 5:
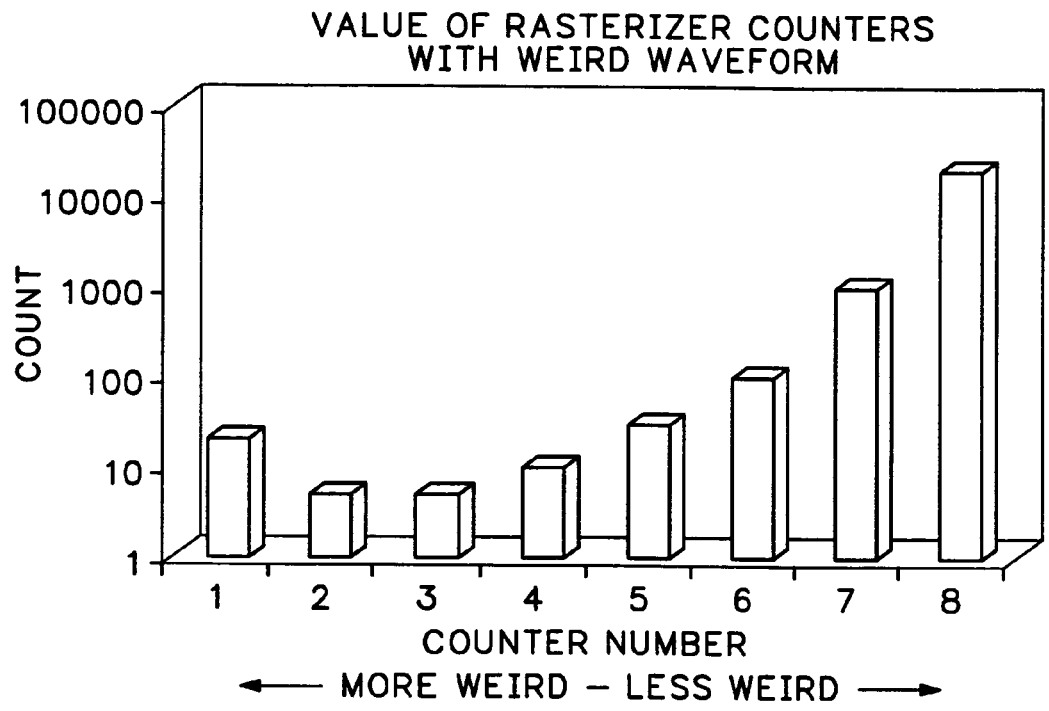
FIG. 5 shows a bar graph view of recent pixel counter outputs for the newly rasterized waveform of FIG. 4 according to the present invention.

One of the functions of the above-described method is to establish a characterization of waveform variability. Where each acquired (or retrieved from memory) waveform is identical to the previous waveform, the number of "new" or rarely active pixels will be very low if not zero. FIG. 3 shows a graphic view of a repetitive waveform taken over several acquisitions. In this case, those history value ranges indicative of infrequently illuminated pixels are unused, while those history value ranges indicative of frequently used pixels exceed threshold levels. In such an instance, the history value range counters effectively characterize waveform variability as being of a low variability. Similarly, where pixel history value ranges associated with new or infrequently selected pixels exhibit a high count, such a high count is indicative of a greater waveform variability. Such a variable waveform is shown in FIG. 4 where an anomaly is observed. FIG. 5 shows a representation of the corresponding counts from the recent pixel counter array 15.

Thus, as each data point of the new waveform is drawn into the raster memory 16 (or processed from the acquisition memory 12), its history value prior to modification is compared with, illustratively, eight contiguous history value ranges and, if the existing history value falls within one of those ranges, the corresponding recent pixel counter $15_1 \ldots 15_N$ associated with that range is incremented. The result is a profile of how much of the waveform is completely new, how much of the waveform is almost new, and so on. If the history value range of the recent pixel counter $15_1$ is zero, then each count within that range is indicative of a completely new pixel. If the history value range is low, then each count associated with that range is indicative of an almost new pixel. By providing greater characterization of waveform variability, the increased information allows much greater discrimination in determining whether or not an anomaly exists. The methodologies of the present invention are suitable for measuring the stability of electrical signals (or optical signals that are converted to electrical signals) as well as other applications.

Localized individual anomalies may be identified by counting excursions of the recent pixel counters 15 beyond one or more threshold levels. Specifically, as successive points of a new waveform are drawn or otherwise processed, a temporary count is maintained of the number of consecutive new points that are found. When a non-new point is found, this temporary count is compared with a threshold to determine if a localized anomaly has occurred, and the count is restarted. In this context, "newness" is identified as completely new (i.e., a point not previously illuminated) or nearly new (i.e., a point illuminated by relatively few prior waveforms). By identifying localized individual anomalies in this manner, the effects of noise on a particular waveform are reduced as excursions that result in counts below the threshold are considered to be noise. This results in a more accurate detection of localized anomalies. The temporary count of the respective history value range counters may not be restarted until a user specified number of non-new points has occurred. In this embodiment, less-localized anomalies are detected while limiting the effect of noise within the rest of the waveform. In other words when new points are encountered, the temporary counter starts counting them until a non-new point is encountered. If the number of non-new points is below another threshold before new points are encountered, the temporary counter continues counting the new points. This results in anomalies that are spread over a larger portion of the newly acquired waveform being detected and located, especially if the location in time of the count start is saved.

Each of the recent pixel counters 15 may be reset to zero after each waveform is processed, or some or all of the pixel counters may be reset only after a specified number of non-new points have occurred, a specified time has elapsed, a specified number of waveforms have been processed or the like. The associated specified numbers may be user selectable or predetermined. In the user selectable embodiment, specification of these parameters may be integrated within the user interface and/or in conjunction with the sensitivity and threshold parameters discussed above. By avoiding the reset of the recent pixel counters 15 on a waveform-by-waveform basis, less-localized anomalies may be detected (as described above) while still limiting the effect of noise from the rest of a particular waveform.

Figure 6:
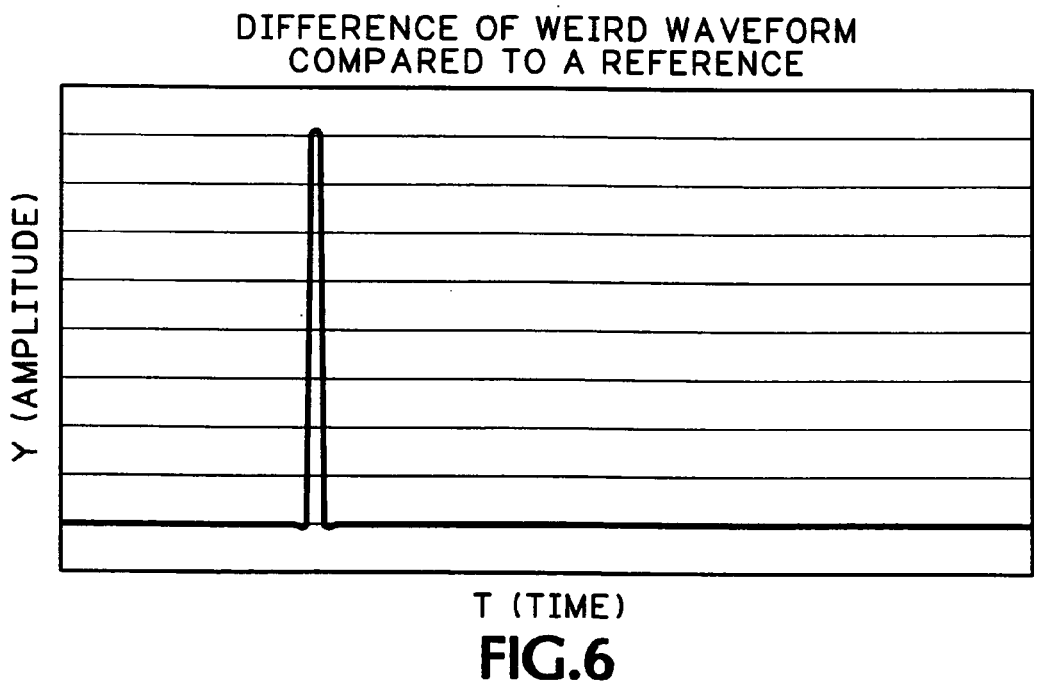
FIG. 6 shows a graphic view of a difference waveform for the newly rasterized waveform of FIG. 4 according to the present invention.
Figure 7:
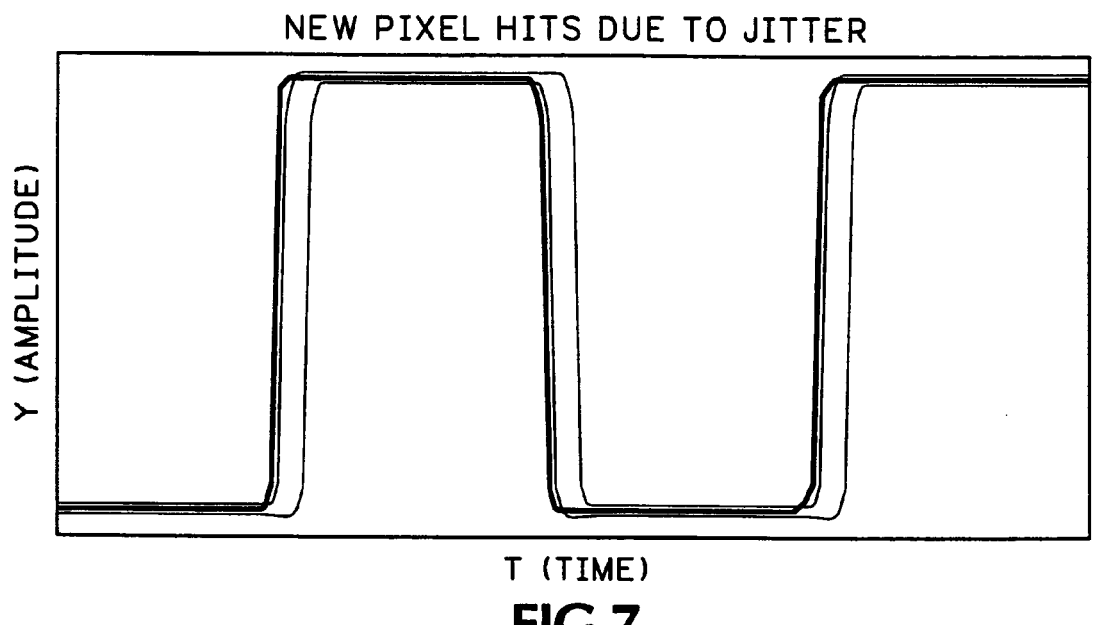
FIG. 7 shows a graphic view of a newly rasterized jitter waveform overlaid on a repetitive waveform rasterized over several acquisitions.
Figure 8:
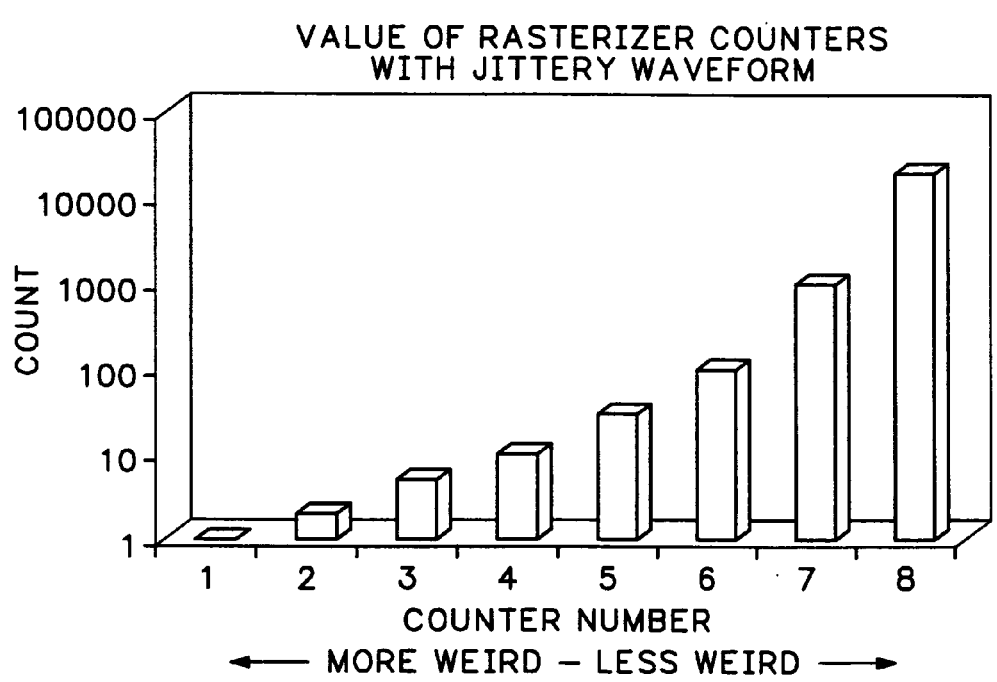
FIG. 8 shows a bar graph view of recent pixel counter outputs for the newly rasterized waveform of FIG. 7 according to the present invention.
Figure 9:
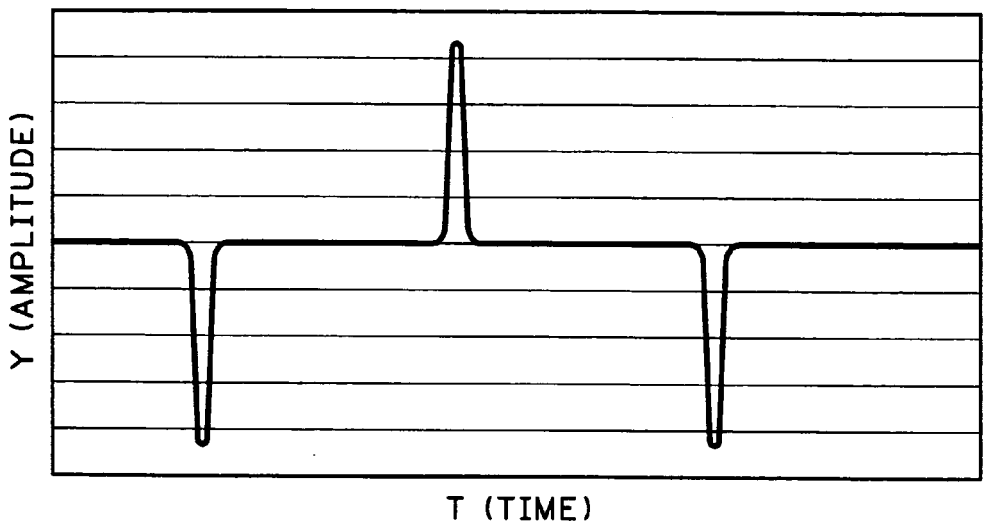
FIG. 9 shows a graphic view of a difference waveform for the newly rasterized waveform of FIG. 7 according to the present invention.

Successive waveforms may be stored in the long term acquisition waveform storage memory 22'. In this embodiment, an alternative anomalous detection method may be invoked where successive waveforms are compared (i.e., subtracted from each other) to produce a difference waveform, as shown in FIG. 6. The difference waveform is then examined to identify a possible local anomaly. Successive positive or negative values are deemed indicative of a more diffuse variation in the waveform signal, which diffuse variation is detectable by examining the difference waveform. FIG. 7 shows a waveform that is affected by jitter, while FIG. 8 shows the corresponding counter values. The difference waveform is shown in FIG. 9. In this manner, the effect of trigger jitter on anomaly detection is reduced. The difference or delta waveform may be processed over its entire width or time period, or processed over a portion of the time period. In still another embodiment of the invention, difference waveform processing is used in conjunction with the above-described thresholding techniques to further insure that anomalous conditions are detected with a high level of immunity from trigger jitter and other factors, i.e., the difference waveforms may be rasterized as well and processed by the recent pixel counter array 15 to provide further information about the variability of the input repetitive signal.

Figure 10:
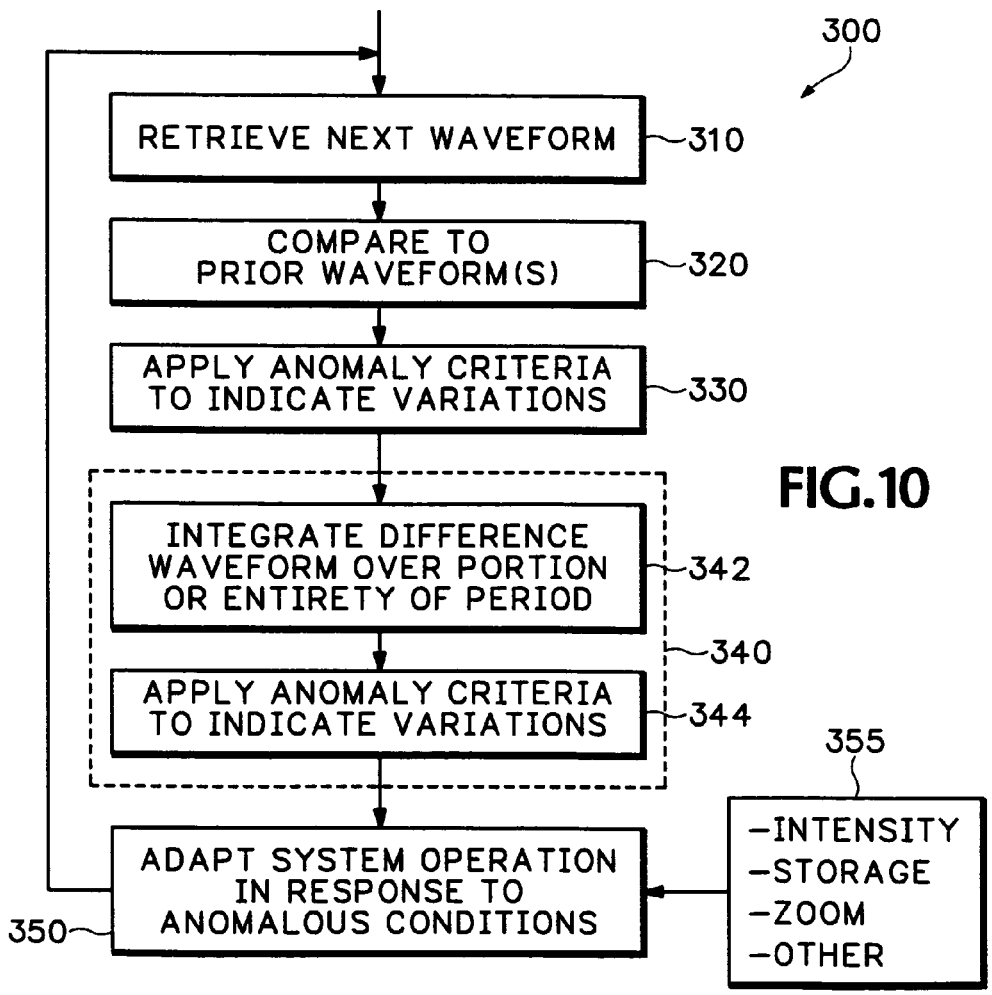
FIG. 10 shows a flow diagram view of an alternate method according to the present invention.

FIG. 10 shows an alternate embodiment where the method 300 is entered at step 310 when a next waveform is retrieved. That is, at step 310 a next waveform is retrieved from a long term storage medium such as raster storage memory 22 or acquisition storage memory 22' (in the case of a non-real-time application or post-processing application).

At step 320, the retrieved waveform is compared to one or more prior waveforms. That is, at step 320 the retrieved waveform is compared to an immediately preceding waveform or a plurality of received waveforms or an average of a plurality of preceding waveforms to establish thereby the difference waveform. As noted above, the difference waveform includes non-zero points indicative of a possible anomalous condition.

At step 330, anomaly criteria are applied to the difference waveform to indicate waveform variations. The anomaly criteria may be, for example, differences beyond a threshold level, number of points that are different between waveforms such as discussed above with respect to FIGS. 1 and 2, and the like.

At step 350, system operation is adapted in response to any anomalous conditions determined. That is, in response to the presence of an anomalous condition, and referring to box 355, the intensity of the waveform associated with the anomalous condition may be adjusted when mapped for the raster scan display 20, the anomalous waveform may be stored, the portion of the waveform associated with the anomaly may be emphasized or "zoomed" and/or other waveform processing steps may be performed. The method 300 then returns to step 310 where the next waveform is retrieved.

An optional step 340 may be performed after step 330. Specifically, at step 342, the difference waveform may be processed over a portion or the entirety of its time period. This operates to smooth noise-related differences to establish thereby a more robust differencing mechanism. At step 344, anomaly criteria are applied to the smoothed difference waveform data to determine thereby whether an anomalous condition exists. As noted above, system operation may then be adapted in response to the anomalous condition at step 350.

While a preferred embodiment of the present invention has been shown and described, many changes and modifications may be made without departing from the invention in its broader aspects.

What is claimed is:

1. A method of characterizing a newly acquired waveform with respect to previously acquired waveforms stored in a raster memory during monitoring of a generally repetitive signal, comprising the steps of:

for each of a plurality of positions within the raster memory associated with the newly acquired waveform, reading a history value representing the previously acquired waveforms which is associated with the position;

incrementing a count of one of a plurality of counters having a history value range corresponding to the history value, each counter having a different history value range;

modifying the history value to produce a new history value;

writing the new history value into the position of the raster memory as the history value; and determining from the counts of the counters, after all the positions associated with the newly acquired waveform have been processed, a variability of the newly acquired waveform with respect to the previously acquired waveforms.

2. The method of claim 1 further comprising the step of providing an anomalous waveform indicator based on the variability.

3. The method of claim 1 wherein a first of the history value ranges comprises an initial history value.

4. The method of claim 1 wherein the newly acquired and previously acquired waveforms are retrieved from an acquisition memory and processed in a non-contemporaneous manner with respect to the monitoring of the generally repetitive signal.

5. The method of claim 2 further comprising the step of storing the newly acquired waveform in a long term memory based on the anomalous waveform indicator.

6. The method of claim 1 further comprising the step of processing each position according to a type identifier associated with it.

7. The method of claim 6 wherein the type identifier indicates that the position is associated with one of a group consisting of an excluded pixel area and a particular input channel.

8. A method comprising the steps of:

rasterizing data associated with a generally repetitive signal to derive therefrom a sequence of waveforms, each waveform having associated with it a plurality of positions within a raster memory;

comparing successive waveforms with prior waveforms in the sequence from the raster memory to produce a difference waveform; and determining from the difference waveform whether an anomalous waveform associated with the generally repetitive signal has been rasterized.

9. The method of claim 8 further comprising the step of processing a portion of the difference waveform to produce a reduced variability difference waveform, the reduced variability difference waveform tending to have non-zero portions indicative of the anomalous waveform.

10. The method of claim 8 further comprising the steps of:

for each of a plurality of positions within the raster memory associated with the difference waveform, reading a history value representing prior difference waveforms from prior successive waveforms which is associated with the position;

incrementing a count in one of a plurality of counters having a history value range corresponding to the history value, each counter having a different history value range;

modifying the history value to produce a new history value;

writing the new history value into the position of the raster memory as the history value; and determining from the counts of the counters after the plurality of positions have been processed a variability of the difference waveform with respect to the prior difference waveforms.

11. The method of claim 10 further comprising the step of providing an anomalous waveform indicator based on the variability.

12. Apparatus for characterizing a newly acquired waveform with respect to previously acquired waveforms during monitoring of a generally repetitive signal, comprising:

a raster memory for storing as a two dimensional array successive waveforms acquired from the generally repetitive signal, where a history value for each location in the two dimensional array represents the previously acquired waveforms;

a plurality of counters, each of the counters having a respective history value range and each producing a count that is incremented in response to the locations in the two dimensional array corresponding to the newly acquired waveform which have history values within the respective history value ranges; and means for analyzing the counts to determine a variability of the newly acquired waveform with respect to the previously acquired waveforms.

13. The apparatus of claim 12 wherein the analyzing means provides an anomalous waveform indicator based on the variability.

14. The apparatus of claim 12 further comprising a raster decay element for periodically decreasing the history values.

15. The apparatus of claim 12 further comprising a process controller for comparing the successive waveforms to produce a difference waveform and for determining from non-zero portions of the difference waveform whether an anomalous waveform associated with the generally repetitive signal has been rasterized.

16. The apparatus of claim 15 wherein the process controller processes a portion of the difference waveform to produce a reduced variability difference waveform, the reduced variability difference waveform having non-zero portions indicative of the anomalous waveform.

17. An improved apparatus for characterizing variabilites in a nominally repetitive waveform signal, the improved apparatus being of the type having means for acquiring a sequence of waveforms from the nominally repetitive waveform signal, means for rasterizing each acquired waveform of the sequence of waveforms into a raster memory, means for identifying new points of each newly acquired waveform with respect to previously acquired waveforms, and means for counting the new points for each acquired waveform to identify an anomalous waveform, wherein the improvement comprises:

means for analyzing a history of the previously acquired waveforms for each newly acquired waveform, as represented by history values in the raster memory associated with the newly acquired waveform, across a plurality of history value ranges to characterize the variabilities:

wherein the analyzing means comprises:

a plurality of counters, each counter corresponding to a different one of the history value ranges, that count for each of the newly acquired waveforms the number of history values of the previously acquired waveforms that fall within each of the history value ranges; and an anomaly detector that analyzes the counts from the plurality of counters after each newly acquired waveform is rasterized to characterize the variabilities of the nominally repetitive waveform signal.

* * * * *